(12) United States Patent
Lee et al.

(10) Patent No.: US 10,629,317 B2
(45) Date of Patent: Apr. 21, 2020

(54) TWO-DIMENSIONAL MAGNETIC-OPTIC TRAP USING FREQUENCY AND PHASE MODULATION WITH ARBITRARY WAVEFORM

(71) Applicant: KOREA RESEARCH INSTITUTE OF STANDARDS AND SCIENCE, Daejeon (KR)

(72) Inventors: Jae Hoon Lee, Daejeon (KR); Jong Chul Mun, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 0 days.

(21) Appl. No.: 16/437,640

(22) Filed: Jun. 11, 2019

(65) Prior Publication Data

US 2019/0385759 A1     Dec. 19, 2019

(30) Foreign Application Priority Data

Jun. 12, 2018   (KR) ........................ 10-2018-0067411

(51) Int. Cl.
| | |
|---|---|
| *G21K 1/00* | (2006.01) |
| *H01F 7/20* | (2006.01) |
| *G02F 1/11* | (2006.01) |
| *H01S 5/00* | (2006.01) |

(52) U.S. Cl.
CPC ............... *G21K 1/006* (2013.01); *G02F 1/11* (2013.01); *H01F 7/20* (2013.01); *H01S 5/0085* (2013.01)

(58) Field of Classification Search
CPC ..................................................... G21K 1/006
See application file for complete search history.

(56) References Cited

U.S. PATENT DOCUMENTS

2013/0048846 A1* 2/2013 Du ........................ G21K 1/006
                                                                250/251

FOREIGN PATENT DOCUMENTS

| JP | 2012019261 A | 1/2012 |
|----|--------------|--------|
| KR | 101617297 B1 | 5/2016 |

OTHER PUBLICATIONS

Jae Hoon Lee et al., entitled, "Optimized Atomic Flux from a Frequency-Modulated Two-Dimensional Magneto-Optical Trap for Cold Fermionic Potassium Atoms" Journal of the Optical Society of America B, vol. 34, No. 7, Jul. 2017, pp. 1415-1420.
Korean Office Action dated Jul. 22, 2019, in Application Serial No. 10-2018-0067411, 5 pages.

* cited by examiner

*Primary Examiner* — Nicole M Ippolito
*Assistant Examiner* — Sean M Luck
(74) *Attorney, Agent, or Firm* — Nixon Peabody LLP; Thomas P. Pavelko

(57) ABSTRACT

The present invention relates to a two-dimensional magnetic-optical trap system using frequency and phase modulation with an arbitrary waveform, including: a glass cell; a coil set; and a light source module, wherein the laser source module includes: a cooling laser; a re-pumping laser; a first acousto-optic modulator; a second acousto-optic modulator; and an electro-optical modulator.

6 Claims, 3 Drawing Sheets

TWO-DIMENSIONAL MAGNETIC-OPTIC TRAP USING FREQUENCY AND PHASE MODULATION WITH ARBITRARY WAVEFORM

CROSS-REFERENCE TO RELATED APPLICATIONS

This application claims priority under 35 U.S.C. § 119 to Korean Patent Application No. 10-2018-0067411, filed on Jun. 12, 2018, in the Korean Intellectual Property Office, the disclosure of which is incorporated herein by reference in its entirety.

TECHNICAL FIELD

The following disclosure relates to a two-dimensional magnetic-optical trap system for fermionic potassium atoms using frequency and phase modulation with an arbitrary waveform, and more particularly, to a two-dimensional magnetic-optical trap system in which an atomic beam flux is improved by control of an effective laser linewidth with an arbitrary waveform through frequency modulation of a laser.

BACKGROUND

Potassium ($^{40}$K) having a mass of 40 has a sufficiently long half-life in spite of a radioisotope, such that it is used for experiments of physics, biology, and geochronology. Many applications for $^{40}$K use radioactive decay characteristics, but atomic physicists are interested in this radioisotope because $^{40}$K is one of the two stable fermionic alkali atoms that may be currently laser-cooled. Once the atoms are laser-cooled, cryogenic atoms may be used for various experiments in quantum precision measurement and quantum information. As compared with cryogenic bosonic atoms, fermions follow the Fermi statistics that prevent fermions from being in the same quantum state. This attribute provides a basis for generating cryogenic atomic samples for observing suppressed collisional dynamics for use in development of a high-precision quantum sensor. By using the fermions with bosons in an atom-based quantum simulator, particularly in an experiment related to simulating a condensed matter physics in which trapped atoms correspond to electrons in solid, potential results of a wide range of experiments are improved.

Particularly, $^{40}$K is a relatively heavy alkali as compared with $^6$Li, and thus provides many advantages for laser cooling and trapping. $^6$Li has a natural abundance ratio high (7.5%) enough to implement a Zeeman slower, but a natural abundance ratio of $^{40}$K is very low (0.012%), such that it is very difficult to directly apply the Zeeman slower for a high flux atomic beam source. Unfortunately, most experiments using $^{40}$K require an isotopically enriched source for the purpose of the appropriate number of trapped atoms, typically up to about 5%.

In order to obtain such an enriched source for a laser cooling experiment, it is necessary to perform a time-consuming process of manufacturing a dispenser or to purchase a pre-manufactured source at high cost. Therefore, it is particularly important to adopt a new technology for improving an atom trapping efficiency in an experiment using $^{40}$K atoms.

In many experiments, a two-dimensional magnetic-optical trap (2D MOT) is a method selected in order to obtain an atomic beam flux source for laser cooling. The 2D MOT has significant advantages as compared with other atomic sources such as the Zeeman slower and a background vapor due to a background pressure maintained to be low, a slow velocity of an output atomic beam flux, and tens of milliseconds. These slow atoms are efficiently captured by a three-dimensional magnetic-optical trap (3D MOT) and are additionally cooled into a sub-Doppler domain, such that cryogenic atoms may be created. In addition, a general size of a system tends to become relatively small as compared with the Zeeman slower, and the system is likely to be smaller with development of a laser beam transfer technology. An atomic beam flux may control a 2D MOT laser beam to easily and effectively turn on and turn off the 2D MOT laser beam.

In a conventional 2D MOT in which a frequency is not modulated, there is a problem that an atomic beam flux is not increased even though a laser intensity is increased.

SUMMARY

An embodiment of the present invention is directed to providing a two-dimensional magnetic-optical trap system using frequency and phase modulation with an arbitrary waveform capable of improving an atomic beam flux of trapped atoms by modulating frequencies of a cooling laser and a re-pumping laser in charge of trap in the dimensional magnetic-optical trap system and applying a laser beam of which a linewidth is increased to atom trap.

In one general aspect, a two-dimensional magnetic-optical trap system using frequency and phase modulation with an arbitrary waveform includes: a glass cell maintained in a vacuum state and having atoms injected thereinto, the atoms being trap targets; a coil set disposed on a top surface, a bottom surface, a front surface, and a back surface of the glass cell and forming a magnetic field in the glass cell; and a light source module allowing laser beams to be incident on the top surface, the bottom surface, the front surface, and the back surface of the glass cell in order to two-dimensionally trap the atoms within the glass cell, wherein the laser source module includes: a cooling laser outputting a beam having a frequency fixed to one peak of saturated absorption signals of the atoms; a re-pumping laser outputting a beam having a frequency fixed to the other peak of the saturated absorption signals of the atoms; a first acousto-optic modulator detuning the frequency of the beam output from the cooling laser; a second acousto-optic modulator detuning the frequency of the beam output from the re-pumping laser; and an electro-optical modulator extending linewidths of a cooling laser beam and a re-pumping laser beam passing through the first acousto-optic modulator and the second acousto-optic modulator, respectively.

The atoms being the trap targets may be potassium ($^{40}$K) having a mass of 40.

A modulated frequency of the electro-optical modulator may be modulated to an arbitrary waveform.

The linewidths of the cooling laser and re-pumping laser beams extended by the electro-optic modulator may be extended to effective laser linewidths that do not have frequency components near atomic transition line resonant frequencies of laser cooling while forming a continuous and near-homogeneous band around the respective central frequencies of the cooling laser and re-pumping laser beams.

The coil set may include: a first coil pair having coils disposed on the top surface and the bottom surface of the glass cell, respectively, and forming a magnetic field in an anti-Helmholtz coil manner; and a second coil pair having coils disposed on the front surface and the back surface of the glass cell, respectively, and forming a magnetic field in an anti-Helmholtz coil manner, and form a magnetic field gradient in an internal space of the glass cell and allows a value of a magnetic field at a position at which the atoms are trapped to be zero.

The laser source module may further include an amplifier amplifying intensities of the cooling laser and re-pumping laser beams after the cooling laser and re-pumping laser beams pass through the electro-optic modulator.

DETAILED DESCRIPTION OF EMBODIMENTS

Hereinafter, exemplary embodiments of the present invention having the configuration as described above will be described in detail with reference to the accompanying drawings.

Figure 1:
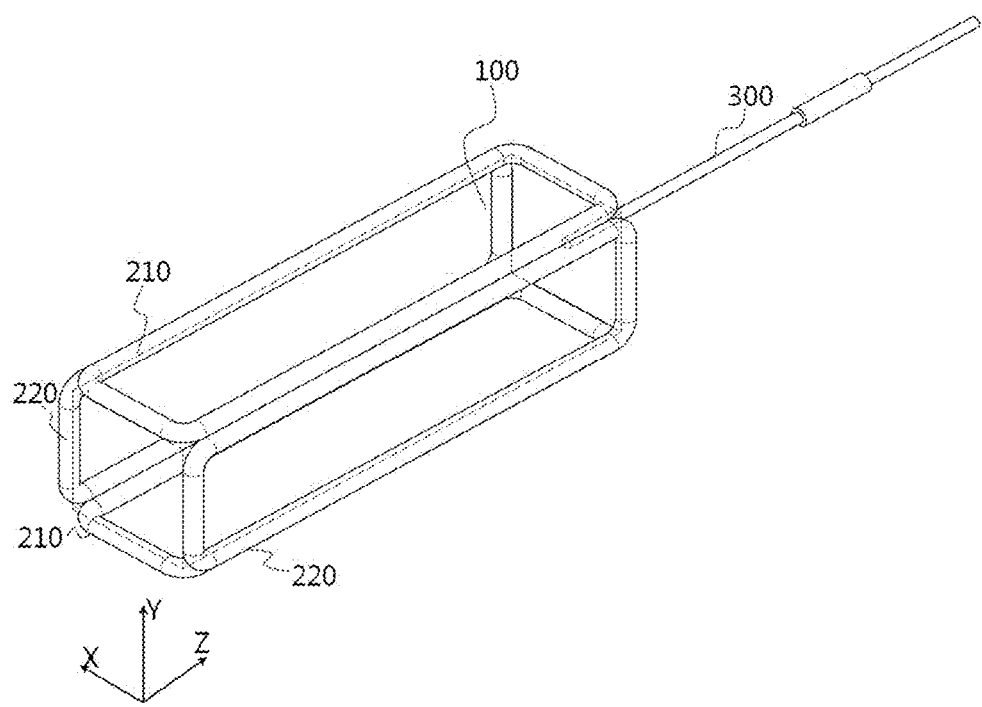
FIG. 1 is a perspective view of a two-dimensional magnetic-optical trap system using frequency and phase modulation with an arbitrary waveform according to an exemplary embodiment of the present invention.
Figure 2:
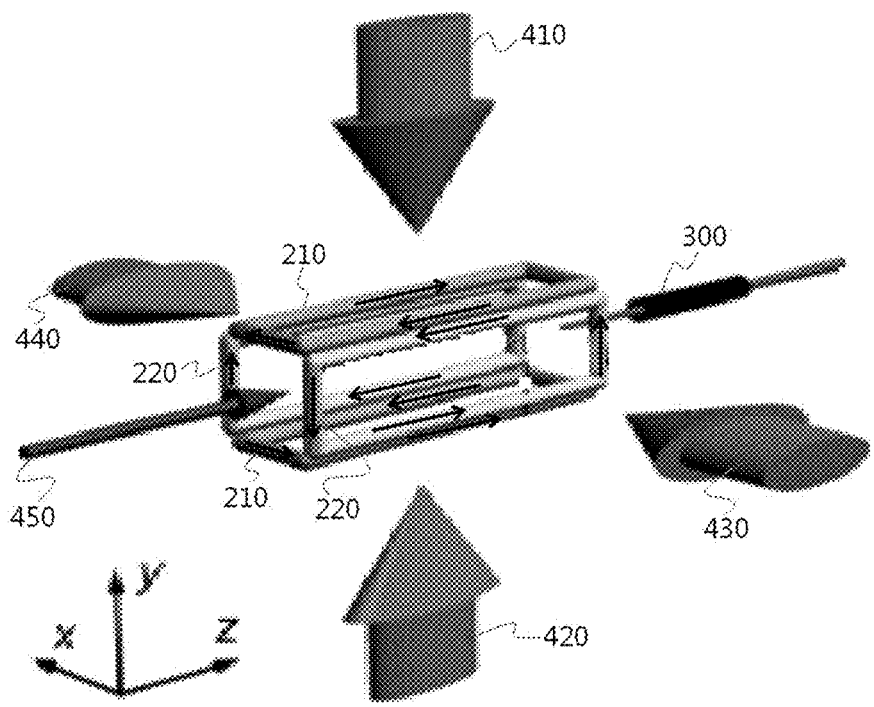
FIG. 2 is a conceptual diagram of the two-dimensional magnetic-optical trap system using frequency and phase modulation with an arbitrary waveform according to an exemplary embodiment of the present invention.
Figure 3:
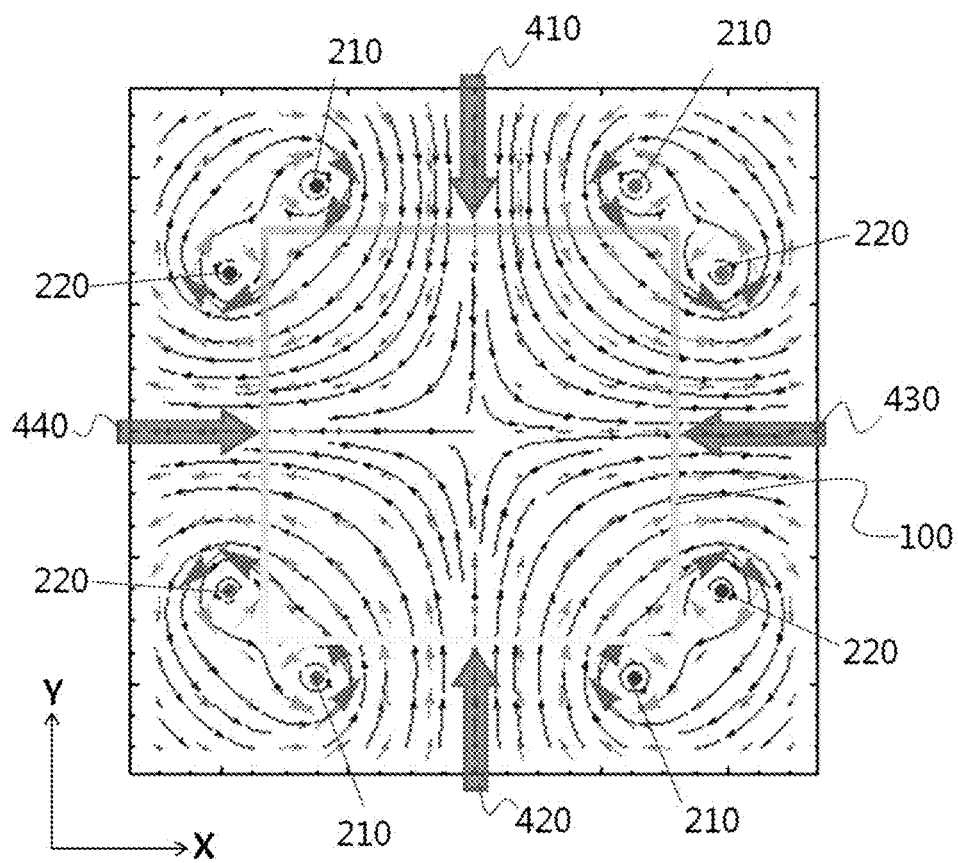
FIG. 3 is a cross-sectional view of the two-dimensional magnetic-optical trap system using frequency and phase modulation with an arbitrary waveform according to an exemplary embodiment of the present invention and is a view illustrating lines of magnetic force.

FIG. 1 is a perspective view of a two-dimensional magnetic-optical trap system using frequency and phase modulation with an arbitrary waveform according to an exemplary embodiment of the present invention, FIG. 2 is a conceptual diagram of the two-dimensional magnetic-optical trap system using frequency and phase modulation with an arbitrary waveform according to an exemplary embodiment of the present invention, and FIG. 3 is a cross-sectional view of the two-dimensional magnetic-optical trap system using frequency and phase modulation with an arbitrary waveform according to an exemplary embodiment of the present invention and is a view illustrating lines of magnetic force.

Referring to FIGS. 1 to 3, a two-dimensional magnetic-optical trap system using frequency and phase modulation with an arbitrary waveform according to an exemplary embodiment of the present invention is configured to include a light source module 400, a glass cell 100, a coil set 200, and a differential pressure tube 300. The glass cell 100 has a rectangular parallelepiped shape, and has a front surface, a back surface, a top surface, and a bottom surface having the same rectangular shape and the same area and a left side surface and a right side surface having the same square shape and the same area. In addition, the right side surface has an opening, and is connected to a pump (not illustrated) making an inner portion of the glass cell vacuum through the opening, and atoms of a trap target are injected through the right side surface. Therefore, the atoms are supplied by a $^{40}$K enriched (5%) dispenser operated so as to maintain a partial pressure of about $2 \times 10^{-10}$ Torr of $^{40}$K in the glass cell 100, and the entire background pressure in the glass cell 100 measured by an ion gauge while operating a two-dimensional magnetic-optical trap (2D MOT) is $5 \times 10^{-9}$ Torr or less.

Two sets of laser beams output from the light source module 400 and propagating in directions reverse to a horizontal direction (x direction) and a vertical direction (y direction), that is, perpendicular to the front surface, the back surface, the top surface, and the bottom surface of the glass cell and propagating from the outside from the glass cell to the inside of the glass cell intersect with each other at a right angle within the glass cell 100. In detail, as illustrated in FIG. 2, the laser beams for forming the 2D MOT are a laser beam 410 toward the top surface of the glass cell, a laser beam 420 toward the bottom surface of the glass cell, a laser beam 430 toward the front surface of the glass cell, and a laser beam 440 from the back surface of the glass cell. These beams 410, 420, 430, and 440 have a narrow and long Gaussian profile.

The coil set 200 includes a first coil pair 210 and a second coil pair 220 having coils in which currents having the same value flow in directions of arrows illustrated on the coils of FIG. 2 and configured in an anti-Helmholtz array, and form gradient magnetic fields along an x axis ($B_x/x|_{y=0}$) and a y axis ($B_y/y|_{x=0}$) in a range from 0 to 32 G/cm. Due to two-dimensional axis symmetry of two coil pairs, a magnetic field along a z axis ($B_z|_{x=0,y=0}$) on which the atoms trapped by the 2D MOT are positioned is "0".

FIG. 3, which is a cross-sectional view of the two-dimensional magnetic-optical trap system using frequency and phase modulation with an arbitrary waveform according to an exemplary embodiment of the present invention taken along an X-Y plane, illustrates lines of magnetic force around the glass cell by the coil set 200. Coils of the first coil pair 210 are positioned on the top surface and the bottom surface of the glass cell, respectively, and have current directions set to form lines of magnetic force of the anti-Helmholtz array as described above. Coils of the second coil pair 220 are positioned on the front surface and the back surface of the glass cell, respectively, and have current directions set to form lines of magnetic force of the anti-Helmholtz array as described above.

A geometrical structure of the magnetic field that is tilted by the set of coils 200 prevents unwanted forces acting on laser-cooled atoms along a z direction. A manner of a two-color push beam 450 is used to apply forces to the atoms along the z axis. Therefore, in order to perform efficient subsequent re-trap of the atoms in a separate vacuum glass cell, a push beam parameter is controlled to adjust a velocity distribution of the atoms exiting the 2D MOT (along the z axis). Red and blue-detuned push beams are collimated to have beam diameters of 4 mm and 1 mm, respectively, at a position of the 2D MOT.

The differential pressure tube 300 having a length of 100 mm and an inner diameter of 4 mm separates a 2D MOT glass cell from a 3D MOT glass cell to provide a pressure difference of $10^4$ or more. The atoms trapped in the 2D MOT move through the differential pressure tube 300 in order to be re-trapped in a 3D MOT (not illustrated). The 3D MOT is disposed at a place spaced apart from the 2D MOT by 450 mm. A pair of anti-Helmholtz magnetic coils provides a gradient magnetic field of about 14 G/cm. Three orthogonal pairs of MOT beams having a beam waist of 12 mm and reversely propagating include one pair in the vertical direction and two pairs at 45° with respect to the z direction and laser-cool and trap atoms introduced from the 2D MOT. Total 3D MOT beam intensities used for cooling and re-pumping transition are 80 mW and 20 mW, respectively.

Unlike the 2D MOT, in the 3D MOT, a laser beam of which a frequency is modulated is not used. A trap velocity of the 3D MOT is calculated to be about 80 m/s, which is three times or more larger than an average atomic beam flux (about 25 m/s) of the 2D MOT+two-color push beam source. In addition, all of the atoms of the 2D MOT passing through the differential pressure tube 300 are considered to be re-trapped in the 3D MOT.

Therefore, performance of the 2D MOT as an atomic beam source is determined by measuring a growth rate of the 3D MOT immediately after the 2D MOT is turned on. Particularly, an atomic beam flux from the 2D MOT passing through the differential pressure tube 300 is assumed to be the same as a 3D MOT loading rate. In order to ensure that this conversion for the atomic beam flux is repeated, the push beam is maintained in a state in which it is not modulated.

Figure 4:
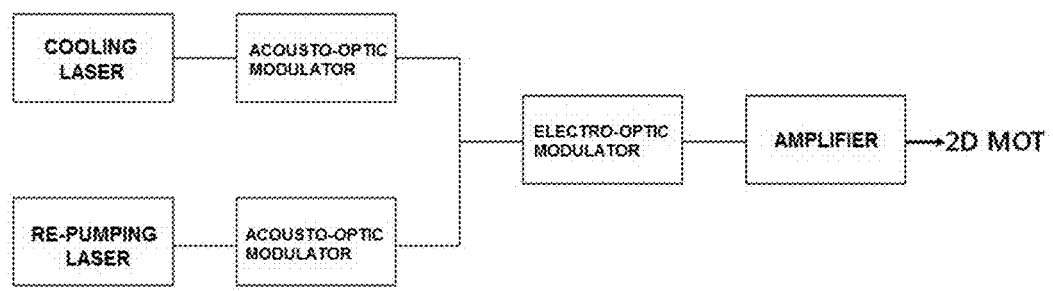
FIG. 4 is a block diagram of a light source module of the two-dimensional magnetic-optical trap system using frequency and phase modulation with an arbitrary waveform according to an exemplary embodiment of the present invention.

FIG. 4 is a block diagram of a light source module of the two-dimensional magnetic-optical trap system using frequency and phase modulation with an arbitrary waveform according to an exemplary embodiment of the present invention.

Referring to FIG. 4, the light source module of the two-dimensional magnetic-optical trap system using frequency and phase modulation with an arbitrary waveform according to an exemplary embodiment of the present invention is configured to include two lasers, first and second acousto-optic modulators red-detuning output frequencies of the respective lasers, an electro-optic modulator extending laser linewidths, and an amplifier amplifying laser intensities.

Figure 5:
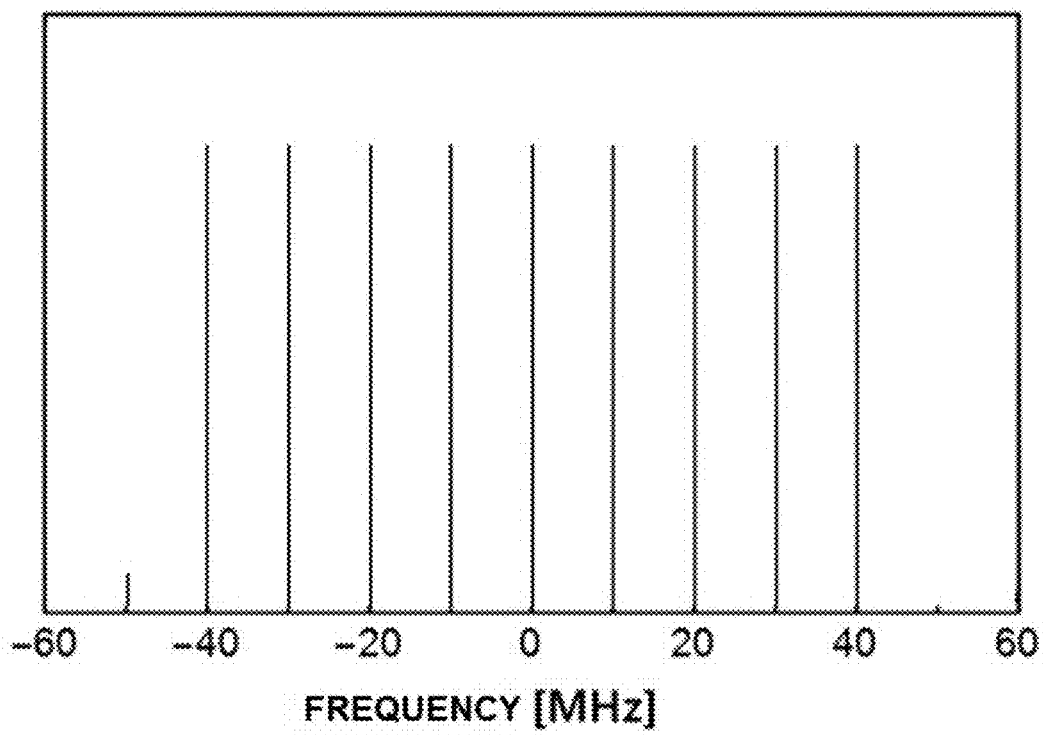
FIG. 5 is a view illustrating a laser waveform modulated through an electro-optic modulator according to an exemplary embodiment of the present invention.
Figure 6:
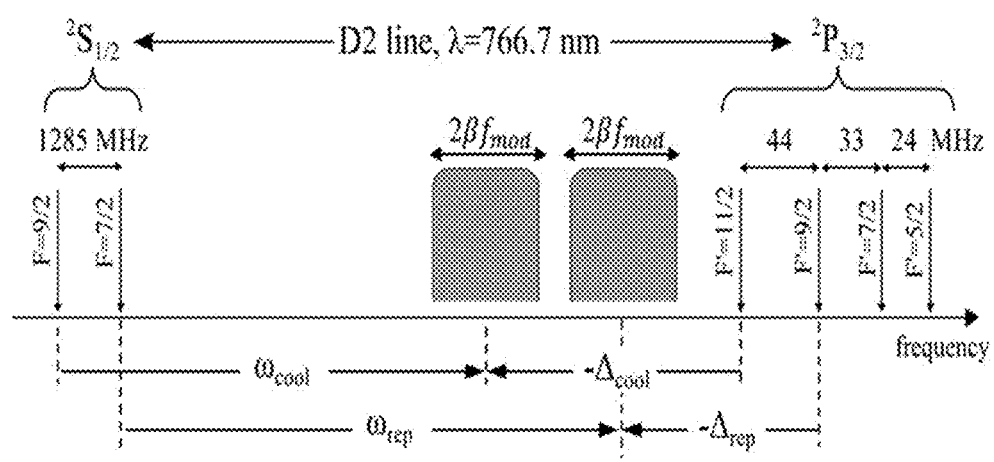
FIG. 6 is a view illustrating a D2 line energy level of $^{40}$K atoms and a frequency and a waveform of an output laser of the light source module according to an exemplary embodiment of the present invention.

FIG. 5 is a view illustrating a laser waveform modulated through an electro-optic modulator according to an exemplary embodiment of the present invention, and FIG. 6 is a view illustrating a D2 line energy level of $^{40}$K atoms and a frequency and a waveform of an output laser of the light source module according to an exemplary embodiment of the present invention.

Referring to FIGS. 5 and 6, when constructing a 2D MOT for fermionic alkali atoms, an atypical hyperfine structure of an atomic energy level compared to bosonic alkali atoms should be considered. $^{40}$K and $^{6}$Li have a large nuclear spin inducing an inverted hyperfine structure as compared with more generally laser-cooled atoms such as $^{87}$Rb, $^{133}$Cs, and $^{39}$K and opposite to an electron spin. Particularly, in a case of $^{40}$K, there are four excited hyperfine levels in a $^{2}P_{3/2}$ state. Here, energy of a maximum total angular momentum state F=11/2 is the lowest. A ground state $^{2}S_{1/2}$ has two hyperfine levels F=7/2 and F=9/2 separated by about 1.3 GHz.

Two external cavity diode lasers (ECDLs) are frequency-locked to a saturated absorption signal of $^{39}$K atoms in a heated vapor cell. A second acousto-optic modulator (AOM) detunes ($\Delta_{rep}$) a frequency ($\omega_{rep}$) of a re-pumping laser beam in an ECDL manner near resonance of a re-pumping transition (F=7/2→F=9/2) of $^{40}$K. An independent offset-locked laser beam referring to a vapor cell absorption signal detunes ($\Delta_{cool}$) a cooling laser frequency ($\omega_{cool}$) near a cooling transition (F=9/2→F=11/2) of $^{40}$K through a first acousto-optic modulator.

The two ECDLs are hereinafter referred to as cooling and re-pumping lasers. Both of the cooling and re-pumping laser beams are combined with each other and double-pass through the electro-optic modulator (EOM) in order to effectively extend the laser linewidths. The EOM may increase the linewidths of the lasers by performing frequency modulation in the most general sinusoidal manner in which resonance is generated at, for example, 10 MHz. Such a shape of the linewidths of the lasers is not the most efficient frequency distribution of the lasers, and the frequency modulation may be performed in a more efficient manner through a multi-component sinusoidal frequency modulation manner or an arbitrary frequency modulation manner. An object of the frequency modulation is to set atoms of different velocity classes to be efficiently laser-cooled to modulate the cooling and re-pumping lasers with the same modulation index R through a single EOM.

FIG. 5 illustrates a laser waveform modulated through the electro-optic modulator, and has an effect that a trap velocity range of atoms is increased by forming side bands to increase laser linewidths. The linewidths of the cooling laser and re-pumping laser beams extended by the electro-optic modulator may be extended without frequency components near atomic transition line resonant frequencies of laser cooling while forming a continuous and near-homogeneous band around the respective central frequencies of the cooling laser and re-pumping laser beams. As a specific example, the linewidths of the modulated laser beams are $2\beta f_{mod}$ and are distributed at approximately 100 MHz, and side bands symmetrical to each other are formed in a range of approximately 50 MHz around central frequencies, which are optimal frequencies of the two lasers, to extend the linewidths of the cooling laser and the re-pumping laser (here, $\beta = \Delta f / f_{mod}$ is a modulation index, $\Delta f$ is a peak frequency deviation from the central frequency, and $f_{mod}$ is a modulated frequency 10 MHz).

The combined laser beams are coupled to a polarization-maintaining (PM) single mode optical fiber to be transferred to a tapered amplifier (TA) in order to be amplified. The amplified cooling and re-pumping laser beams are again coupled to the PM optical fiber to be transferred to the 2D MOT. Laser intensities corresponding to the cooling and re-pumping transitions are independently adjusted by the AOMs controlled by a proportional integral derivative (PID) feedback before the laser beams are amplified in the TA, and are measured using a Fabry-Perot spectrometer having a resolution of 5 MHz. The central frequencies of the cooling and re-pumping laser beams are adjusted by the same AOM controlling an amplitude. A laser beam for the 3D MOT is controlled independently of a beam for a 2D MOT, and is transmitted to its own TA through a separate path in order to be amplified.

The two-dimensional magnetic-optical trap system using frequency modulation according to the present invention may obtain an improved atomic beam flux as compared with a general two-dimensional magnetic-optical trap system from modulation of the cooling and re-pumping laser beams.

In addition, improvement of a cooling efficiency of $^{40}$K, which is one of the two stable fermionic alkali atoms that may be currently laser-cooled, is important in that a natural abundance ratio of $^{40}$K is very low and a production cost of an enriched $^{40}$K vapor source is high.

Although the present invention has been described with reference to exemplary embodiments illustrated in the drawings, it is only an example, and it will be understood by those skilled in the art that various modifications and equivalent other exemplary embodiments are possible from the present invention. Therefore, the actual technical protection scope of the present invention is to be defined by the claims.

[Detailed Description of Main Elements]

100: glass cell
200: coil set
210: first coil pair
220: second coil pair
300: differential pressure tube
400: light source module

What is claimed is:

1. A two-dimensional magnetic-optical trap system using frequency and phase modulation with an arbitrary waveform, comprising:
  a glass cell maintained in a vacuum state and having atoms injected thereinto, the atoms being trap targets;
  a coil set disposed on a top surface, a bottom surface, a front surface, and a back surface of the glass cell and forming a magnetic field in the glass cell; and
  a light source module allowing laser beams to be incident on the top surface, the bottom surface, the front surface, and the back surface of the glass cell in order to two-dimensionally trap the atoms within the glass cell,
  wherein the laser source module includes:
  a cooling laser outputting a beam having a frequency fixed to one peak of saturated absorption signals of the atoms;
  a re-pumping laser outputting a beam having a frequency fixed to the other peak of the saturated absorption signals of the atoms;
  a first acousto-optic modulator detuning the frequency of the beam output from the cooling laser;
  a second acousto-optic modulator detuning the frequency of the beam output from the re-pumping laser; and
  an electro-optical modulator extending linewidths of a cooling laser beam and a re-pumping laser beam passing through the first acousto-optic modulator and the second acousto-optic modulator, respectively.

2. The two-dimensional magnetic-optical trap system using frequency and phase modulation with an arbitrary waveform of claim 1, wherein the atoms being the trap targets are potassium ($^{40}$K) having a mass of 40.

3. The two-dimensional magnetic-optical trap system using frequency and phase modulation with an arbitrary waveform of claim 1, wherein a modulated frequency of the electro-optical modulator is modulated to an arbitrary waveform.

4. The two-dimensional magnetic-optical trap system using frequency and phase modulation with an arbitrary waveform of claim 1, wherein the linewidths of the cooling laser and re-pumping laser beams extended by the electro-optic modulator are extended to effective laser linewidths that do not have frequency components near atomic transition line resonant frequencies of laser cooling while forming a continuous and near-homogeneous band around the respective central frequencies of the cooling laser and re-pumping laser beams.

5. The two-dimensional magnetic-optical trap system using frequency and phase modulation with an arbitrary waveform of claim 1, wherein the coil set includes:
  a first coil pair having coils disposed on the top surface and the bottom surface of the glass cell, respectively, and forming a magnetic field in an anti-Helmholtz coil manner; and
  a second coil pair having coils disposed on the front surface and the back surface of the glass cell, respectively, and forming a magnetic field in an anti-Helmholtz coil manner, and
  forms a magnetic field gradient in an internal space of the glass cell and allows a value of a magnetic field at a position at which the atoms are trapped to be zero.

6. The two-dimensional magnetic-optical trap system using frequency and phase modulation with an arbitrary waveform of claim 1, wherein the laser source module further includes an amplifier amplifying intensities of the cooling laser and re-pumping laser beams after the cooling laser and re-pumping laser beams pass through the electro-optic modulator.

* * * * *